US011837496B2

(12) United States Patent
Sun et al.

(10) Patent No.: US 11,837,496 B2
(45) Date of Patent: Dec. 5, 2023

(54) SUBSTRATE PROCESSING APPARATUS AND METHOD OF PROCESSING A SUBSTRATE

(71) Applicant: SAMSUNG ELECTRONICS CO., LTD., Suwon-si (KR)

(72) Inventors: Jong Woo Sun, Hwaseong-si (KR); Sung Moon Park, Hwaseong-si (KR); Je Woo Han, Hwaseong-si (KR); Kwang Nam Kim, Hwaseong-si (KR); Ho Chang Lee, Hwaseong-si (KR); Young Hoon Jeong, Hwaseong-si (KR); Masayuki Tomoyasu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 196 days.

(21) Appl. No.: 17/324,229

(22) Filed: May 19, 2021

(65) Prior Publication Data

US 2021/0272838 A1 Sep. 2, 2021

Related U.S. Application Data

(63) Continuation of application No. 16/559,762, filed on Sep. 4, 2019, now Pat. No. 11,018,046.

(30) Foreign Application Priority Data

Apr. 12, 2019 (KR) .................. 10-2019-0043250
May 14, 2019 (KR) .................. 10-2019-0056599

(51) Int. Cl.
*H01L 21/687* (2006.01)
*H01L 21/67* (2006.01)
*H01J 37/32* (2006.01)

(52) U.S. Cl.
CPC .... *H01L 21/68735* (2013.01); *H01J 37/3244* (2013.01); *H01J 37/32532* (2013.01);
(Continued)

(58) Field of Classification Search
CPC ................ H01J 37/321; H01J 37/3244; H01J 37/32642; H01J 37/32082;
(Continued)

(56) References Cited

U.S. PATENT DOCUMENTS 7,658,816 B2  2/2010  Koshiishi et al.
8,056,503 B2  11/2011  Kikuchi et al.
(Continued)

FOREIGN PATENT DOCUMENTS

KR  10-2018-0110653 A  10/2018
KR     10-1927936 B1  12/2018
KR  10-2019-0009447 A   1/2019

OTHER PUBLICATIONS

Korean Office Action dated Oct. 6, 2023.

*Primary Examiner* — Yuechuan Yu
(74) *Attorney, Agent, or Firm* — Lee IP Law, P.C.

(57) ABSTRACT

A substrate processing apparatus including a process chamber; a susceptor in the process chamber; and an inner edge ring and an outer edge ring on the susceptor, wherein the inner edge ring includes a semiconductor, the outer edge ring includes an insulator, an upper surface of the outer edge ring is at a higher level than an upper surface of the inner edge ring, and the outer edge ring has an overhang extending onto the inner edge ring.

5 Claims, 7 Drawing Sheets

(52) U.S. Cl.
CPC .. *H01J 37/32642* (2013.01); *H01L 21/67069* (2013.01); *H01L 21/6875* (2013.01)

(58) Field of Classification Search
CPC ......... H01J 37/32532; H01L 21/67069; H01L 21/68735; H01L 21/6875
See application file for complete search history.

(56) References Cited

U.S. PATENT DOCUMENTS

| | | |
|---|---|---|
| 8,500,953 B2 | 8/2013 | Chang et al. |
| 9,184,074 B2 | 11/2015 | Dhindsa et al. |
| 9,349,618 B2 | 5/2016 | Yamawaku et al. |
| 2014/0130743 A1* | 5/2014 | Toriya ............... C23C 16/45574 118/725 |
| 2016/0211166 A1 | 7/2016 | Yan et al. |
| 2017/0213758 A1* | 7/2017 | Rice .................. H01J 37/32082 |
| 2018/0358211 A1 | 12/2018 | Mun |

* cited by examiner

SUBSTRATE PROCESSING APPARATUS AND METHOD OF PROCESSING A SUBSTRATE

CROSS-REFERENCE TO RELATED APPLICATIONS

This is a continuation application based on pending application Ser. No. 16/559,762 filed Sep. 4, 2019, the entire contents of which is hereby incorporated by reference.

Korean Patent Application No. 10-2019-0043250, filed on Apr. 12, 2019, and Korean Patent Application No. 10-2019-0056599, filed on May 14, 2019, in the Korean Intellectual Property Office, and entitled: "Substrate Processing Apparatus Including Edge Ring," is incorporated by reference herein in its entirety.

BACKGROUND

1. Field

Embodiments relate to a substrate processing apparatus including an edge ring.

2. Description of the Related Art

In a substrate processing apparatus, the etching of an edge region of a substrate may not be completely uniform due to the distortion of an electric field, e.g., as a result of plasma discontinuity.

SUMMARY

The embodiments may be realized by providing a substrate processing apparatus including a process chamber; a susceptor in the process chamber; and an inner edge ring and an outer edge ring on the susceptor, wherein the inner edge ring includes a semiconductor, the outer edge ring includes an insulator, an upper surface of the outer edge ring is at a higher level than an upper surface of the inner edge ring, and the outer edge ring has an overhang extending onto the inner edge ring.

The embodiments may be realized by providing a substrate processing apparatus including a process chamber; a susceptor in the process chamber; and a first edge ring, a second edge ring, and a third edge ring outside the susceptor, wherein the susceptor has an upper surface on which a substrate is mountable, and a step surface on which the first edge ring is disposed, the first edge ring and the second edge ring are stationary relative to the susceptor, and the third edge ring is coupled with the first edge ring and the second edge ring on the first edge ring and the second edge ring to be vertically movable relative thereto.

The embodiments may be realized by providing a substrate processing apparatus including a process chamber; a susceptor inside the process chamber and on which a substrate is mountable; a stationary edge ring outside the susceptor; and a movable edge ring outside the stationary edge ring, wherein the stationary edge ring has a step surface at a same level as an upper surface of the susceptor, and an upper surface at a higher level than the substrate when mounted on the susceptor, the movable edge ring is vertically movable to have an upper surface at the same level as or a higher level than the upper surface of the stationary edge ring, and the stationary edge ring has a U-shaped cross-section that includes a stationary insertion groove and a stationary protrusion.

BRIEF DESCRIPTION OF THE DRAWINGS

Features will be apparent to those of skill in the art by describing in detail exemplary embodiments with reference to the attached drawings in which:

FIG. 5b illustrates enlarged cross-sectional perspective views of a portion of an edge ring shown in FIG. 5a.

DETAILED DESCRIPTION

Figure 1:
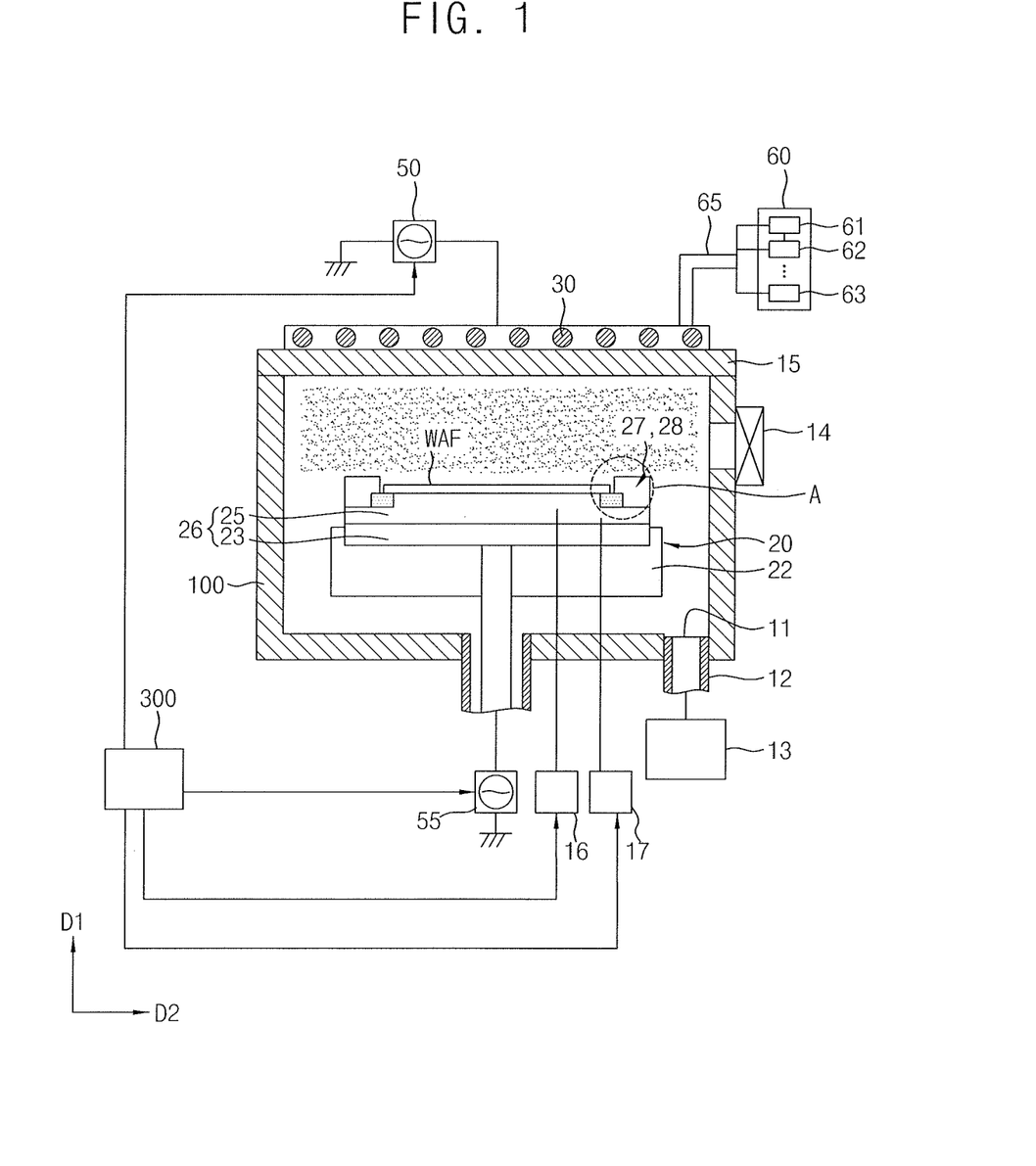
FIG. 1 illustrates a cross-sectional view of a substrate processing apparatus according to an example embodiment.

FIG. 1 illustrates a cross-sectional view of a substrate processing apparatus according to an example embodiment. In an implementation, the substrate processing apparatus may be a plasma etching apparatus that uses plasma. In an implementation, the substrate processing apparatus may be an inductively coupled plasma (ICP) etching apparatus. The ICP etching apparatus may generate plasma from an etch gas sprayed by a gas nozzle using an electromagnetic field induced by a coil-type antenna and perform an etching process. High-frequency power supplied to the coil-type antenna may be transmitted to the etch gas through a dielectric plate. In an implementation, the substrate processing apparatus may be a microwave plasma etching apparatus.

Referring to FIG. 1, the substrate processing apparatus may include, e.g., a process chamber 100, a substrate stage 20, an upper electrode 30, and a plasma generator 50 and 55. The substrate processing apparatus may include a gas supply, a temperature controller 60, a heater power supply 17, and a controller 300.

The process chamber 100 may provide an airtight or sealed space to process a substrate WAF with plasma. An exhaust port 11 and an exhaust pipe 12 may be installed in (e.g., under or at a lower side of) the process chamber 100. The process chamber 100 may be connected to an exhaust 13 through the exhaust pipe 12. The exhaust 13 may include, e.g., a vacuum pump, and may adjust an interior of the process chamber 100 to a pressure of a desired degree of vacuum. A gate 14 to load and unload the substrate WAF into and from the process chamber 100 may be in a sidewall of the process chamber 100.

A window 15 may be in or at an upper portion of the process chamber 100. The window 15 may constitute a part of or the entire upper portion of the process chamber 100. For example, the window 15 may include an insulating material such as aluminum oxide ($Al_2O_3$).

The substrate stage 20 may be in the process chamber 100. The substrate stage 20 may include a support 22 and a susceptor 26. The susceptor 26 may include a lower electrode 23 and a fixing chuck 25.

The lower electrode 23 may be on the support 22. The lower electrode 23 may have a disc shape. The lower electrode 23 may include, e.g., a metal such as aluminum (Al), titanium (Ti), stainless steel, tungsten (W), or an alloy thereof.

The fixing chuck 25 may be on the lower electrode 23. The fixing chuck 25 may include an electrostatic chuck (ESC) including a dielectric layer and an adsorption electrode. For example, the dielectric layer may include a dielectric material such as an aluminum oxide ($Al_2O_3$) layer, an aluminum nitride (AlN) layer, an yttrium oxide ($Y_2O_3$) layer, a resin, or the like. The adsorption electrode may include a metal, such as tungsten (W), copper (Cu), nickel (Ni), or the like, or a conductor such as tungsten carbide (WC). The ESC may be electrically connected to an ESC power supply 16 and the controller 300. A direct-current (DC) voltage may be applied from the ESC power supply 16 to the adsorption electrode of the ESC, and electrostatic force may be generated between the adsorption electrode and the substrate WAF so that the substrate WAF may be adsorbed on or held by the ESC.

The fixing chuck 25 may include a heater. The heater may include a heater dielectric layer including a dielectric material and a heater electrode including a conductor. The heater may be electrically connected to the heater power supply 17 and the controller 300. For example, in the heater, the heater electrode may be heated due to an alternating-current (AC) voltage supplied by the heater power supply 17 to adjust temperatures of the fixing chuck 25 and the substrate WAF.

The substrate WAF may be mounted on the susceptor 26 (e.g., the removable substrate WAF may be accommodatable or mountable on the susceptor 26). An edge ring 27 and 28 may be along or around an outer circumference of the substrate WAF and on the susceptor 26. The edge ring 27 and 28 may have a greater diameter than the substrate WAF. The edge ring 27 and 28 may include, e.g., a conductive material and an insulating material. The edge ring 27 and 28 may help improve the uniformity of the etching of the substrate WAF.

The upper electrode 30 may be on the window 15 opposite to the lower electrode 23. A space between the upper electrode 30 and the lower electrode 23 may be a plasma-generating space. The upper electrode 30 may include a high-frequency antenna. The high-frequency antenna may be an inductively coupled antenna.

The plasma generator 50 and 55 may be outside the process chamber 100. The plasma generator 50 and 55 may include a high-frequency power supply 50 and a bias power supply 55. The high-frequency power supply 50 may be electrically connected to the upper electrode 30. The high-frequency power supply 50 may output high-frequency power appropriate for generating plasma. The high-frequency power supply 50 may include a high-frequency power source and an impedance matcher.

The bias power supply 55 may be electrically connected to the lower electrode 23. High-frequency power may be applied by the bias power supply 55 to the lower electrode 23, and the lower electrode 23 may serve as an electrode for generating plasma.

The gas supply 60 may be connected to the process chamber 100 through a gas supply pipe 65. The gas supply 60 may supply gases to the process chamber 100. The gas supply 60 may include a main etch gas supply 61 to supply a main etch gas for etching a material layer on the substrate WAF, a protective gas supply 62 to supply a protective gas for protecting an etched etching pattern, and an inert gas supply 63 for adjusting the concentrations of the main etch gas and an auxiliary etch gas. The gas supply 60 may adjust a concentration of the main etch gas and a concentration of the auxiliary etch gas to a concentration of an inert gas.

The controller 300 may control the high-frequency power supply 50, the bias power supply 55, the ESC power supply 16, and the heater power supply 17. The controller 300 may include a microcomputer and various interfaces and control a plasma processing operation according to program and recipe information stored in an external memory or an internal memory.

The substrate WAF may be mounted on the ESC 24 in the process chamber 100 through the gate 14 so that the substrate processing apparatus may perform an etching process. Power may be applied from the ESC power supply 16 to the ESC 24, and the substrate WAF may be adsorbed on or held by the ESC due to electrostatic force generated due to the power.

An etch gas may be supplied from the gas supply 60 into the process chamber 100. The exhaust 13 may adjust an inner pressure of the process chamber 100 using a vacuum pump. The high-frequency power supply 50 may supply power from the high-frequency power source through the impedance matcher to the upper electrode 30. The bias power supply 55 may supply power to the lower electrode 23.

The etch gas supplied into the process chamber 100 may be uniformly diffused in the process chamber 100 under the window 15. A magnetic field may be generated due to current flowing through the upper electrode 30 and the high-frequency antenna, and a line of magnetic force may pass through the window 15 and pass through the process chamber 100. An induced electric field may be generated according to a temporal change of the magnetic field, and electrons accelerated by the induced electric field may collide with molecules or atoms of the etch gas to generate plasma.

Figure 2:
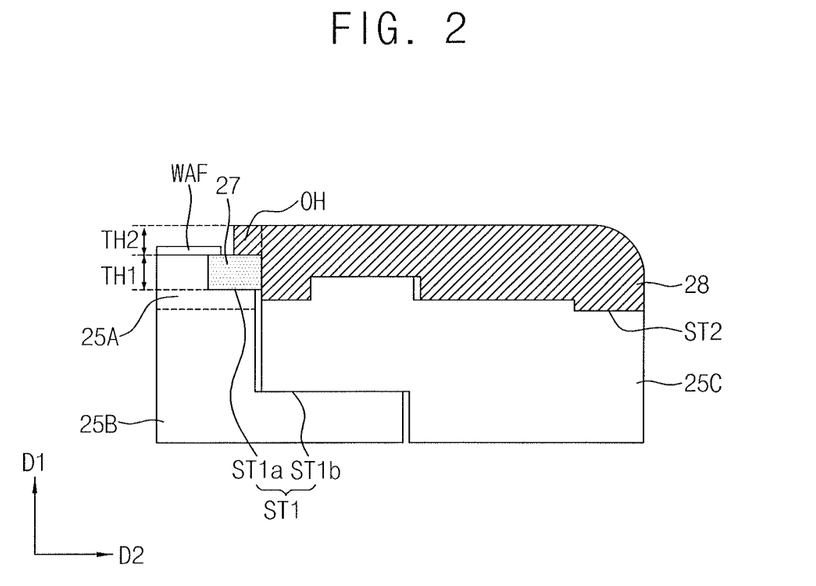
FIG. 2 illustrates an enlarged cross-sectional view of a partial region of a substrate processing apparatus according to an example embodiment.

FIG. 2 illustrates an enlarged cross-sectional view of a partial region of a substrate processing apparatus according to an example embodiment. For example, FIG. 2 illustrates an enlarged view corresponding to region A of FIG. 1.

Referring to FIGS. 1 and 2, the fixing chuck 25 of the susceptor 26 may include a first portion 25A, a second portion 25B, and a third portion 25C. The first portion 25A may be on the second portion 25B. The third portion 25C may be on a side surface of the second portion 25B. The fixing chuck 25 may have an upper surface (e.g., a surface facing away from the support 22) on which a substrate WAF is mountable and a first step surface ST1 on which the inner edge ring 27 is mounted. The first step surface ST1 may include an upper step surface ST1a provided by or of the first portion 25A and a lower step surface ST1b provided by or of the second portion 25B. The upper surface on which the substrate WAF is mountable may have a smaller diameter than the substrate WAF. A portion of the second portion 25B may be under the third portion 25C (e.g., such that the portion of the second portion 25B is between the third portion 25C and the support 22 in a first or vertical direction D1). The third portion 25C may have a second step surface ST2, and the outer edge ring 28 may be on the second step surface ST2 of the third portion 25C. In an implementation, the first portion 25A and/or the second portion 25B may include an ESC. In an implementation, the first portion 25A may be a substrate mount on which the substrate WAF is mountable and which includes a dielectric material, and the second portion 25B may be an ESC including a dielectric material and an adsorption electrode. The third portion 25C may include an insulating material.

The inner edge ring 27 may be on the upper step surface ST1a of the susceptor 26. In an implementation, an inner portion of the inner edge ring 27 may overlap (e.g., underlie) and/or be in contact with an edge of the substrate WAF mounted on the susceptor 26. In an implementation, a portion of an upper surface (e.g., surface facing away from the support 22) of the inner edge ring 27 may be in contact with (e.g., direct contact with) a lower (e.g., a susceptor 26-facing) surface of the substrate WAF. The upper surface of the inner edge ring 27 may be substantially coplanar with an upper surface of the first portion 25A of the susceptor 26. For example, the upper surface of the inner edge ring 27 may be coplanar with an upper surface of the susceptor 26. The inner edge ring 27 may be in contact with a side surface of the first portion 25A. In an implementation, the upper surface of the inner edge ring 27 may be spaced apart from the lower surface of the substrate WAF (e.g., in the vertical direction D1). For example, the upper surface of the inner edge ring 27 may be at a lower level than the upper surface of the first portion 25A and an upper surface of the substrate WAF (e.g., a distance from the support 22 to the upper surface of the inner edge ring 27 in the vertical direction D1 may be less than a distance from the support 22 to the upper surface of the first portion 25A in the vertical direction D1 and a distance from the support 22 to an upper surface of the substrate WAF in the vertical direction D1). A side surface of the inner edge ring 27 may be spaced apart from the side surface of the first portion 25A (e.g., in a second or radial direction D2). In an implementation, the inner edge ring 27 may include, e.g., a semiconductor material. In an implementation, the inner edge ring 27 may include, e.g., silicon carbide (SiC).

The outer edge ring 28 may be outside the inner edge ring 27 (e.g., may surround the inner edge ring 27). The outer edge ring 28 may be in contact with the upper surface and/or an outer side surface of the inner edge ring 27. In an implementation, the outer edge ring 28 may not be in contact with the side surface of the inner edge ring 27. The outer edge ring 28 may be on the second step surface ST2 provided by or of the third portion 25C. The outer edge ring 28 may have a lower (e.g., a susceptor 26-facing) surface that is a step surface corresponding or complementary to the second step surface ST2. At least a portion of the lower surface (e.g., the step surface) of the outer edge ring 28 may be at a lower level than a lower (e.g., a susceptor 26-facing) surface of the inner edge ring 27 (e.g., a distance from the support 22 to the lower surface of the outer edge ring 28 in the vertical direction D1 may be less than a distance from the support 22 to the lower surface of the inner edge ring 27 in the vertical direction D1). A portion (hereinafter, referred to as an overhang portion) OH of an upper portion of the outer edge ring 28 may extend in an overhang form to overlap or overlie the first portion 25A and the second portion 25B (e.g., such that the first portion 25A and the second portion 25B may be between the support 22 and the overhang portion OH). The overhang portion OH of the outer edge ring 28 may extend (e.g., inwardly) onto the inner edge ring 27. A lower surface of the overhang portion OH may be in contact with (e.g., direct contact with) the upper surface of the inner edge ring 27. An upper surface of the outer edge ring 28 may be at a higher level than the upper surface of the inner edge ring 27 and the upper surface of the substrate WAF (e.g., a distance from the support 22 to the upper surface of the outer edge ring 28 in the vertical direction D1 may be greater than a distance from the support 22 to the upper surface of the inner edge ring 27 and a distance from the support 22 to the upper surface of the substrate WAF in the vertical direction D1). In an implementation, the outer edge ring 28 may include, e.g., an insulating material. In an implementation, the outer edge ring 28 may include, e.g., quartz. In an implementation, a thickness TH2 of the overhang portion OH (in the vertical direction D1) may be, e.g., 0.7 to 1.2 times a thickness of the inner edge ring 27 (in the vertical direction D1). In an implementation, the thickness TH2 of the overhang portion OH may be, e.g., 0.7 to 0.8 times the thickness of the inner edge ring 27. In an implementation, the thickness TH2 of the overhang portion OH of the outer edge ring 28 may be, e.g., 3.5 mm to 6 mm. In an implementation, the thickness TH1 of the inner edge ring 27 may be, e.g., 5 mm to 7.5 mm.

Figure 3:
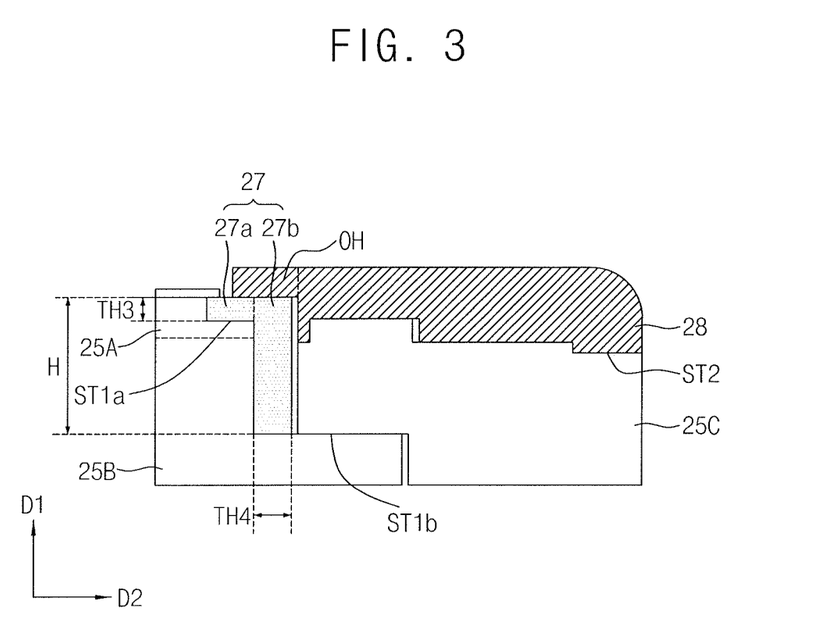
FIG. 3 illustrates an enlarged cross-sectional view of a partial region of a substrate processing apparatus according to an example embodiment.

FIG. 3 illustrates an enlarged cross-sectional view of a partial region of a substrate processing apparatus according to an example embodiment. For example, FIG. 3 illustrates an enlarged view corresponding to the region A of FIG. 1. In FIGS. 1 to 3, the same reference numerals are used to denote the same elements. Hereinafter, repeated descriptions which are substantially the same as in FIGS. 1 and 2 may be omitted for brevity.

Referring to FIGS. 1 and 3, an inner edge ring 27 may have an L-shaped cross-section having an upper surface and a step surface. The inner edge ring 27 may be on the first portion 25A and the second portion 25B of the fixing chuck 25, which provide the first step surface ST1a and ST1b. The first step surface ST1a and ST1b may include the upper step surface ST1a provided by or of the first portion 25A and the lower step surface ST1b provided by or of the second portion 25B. The inner edge ring 27 may include an inner unit or inner ring 27a on the upper step surface ST1a of the first portion 25A, and an outer unit or outer ring 27b on the lower step surface ST1b of the second portion 25B. In an implementation, the outer ring 27b may be connected to the inner ring 27a at an outer side of the inner edge ring 27 (e.g., at an outer side of the inner ring 27a). The outer ring 27b may extend downwardly vertically (e.g., in the vertical direction D1) in a long manner at the outer side of the inner ring 27a and may be between (e.g., a part of) the second portion 25B and the third portion 25C. The outer ring 27b may be in contact with a side surface of the second portion 25B. In an implementation, the inner edge ring 27 may be divided into an upper portion, which is in contact with a side surface of the first portion 25A that is a substrate mount, and a lower portion, which is in contact with the side surface of the second portion 25B that is an ESC. The lower portion of the inner edge ring 27 may extend downwardly (e.g., in the vertical direction D1) along the side surface of the ESC from the upper portion of the inner edge ring 27. In an implementation, the inner edge ring 27 may be spaced apart (e.g., in the radial direction D2) from the side surface of the first portion 25A and the side surface of the second portion 25B.

An overhang portion OH of an outer edge ring 28 may overlap or overlie a portion of the inner ring 27a and the outer ring 27b of the inner edge ring 27 (e.g., a portion of the inner ring 27a and the outer ring 27b may be between the support 22 and the overhang portion OH in the vertical direction D1). The overhang portion OH of the outer edge ring 28 may have a greater width (in the radial direction D2) than a width (in the radial direction D2) of the outer ring 27b of the inner edge ring 27. In an implementation, a height H (in the vertical direction D1) of the outer ring 27b may be, e.g., 1.4 to 4 times a thickness TH3 (in the vertical direction D1) of the inner ring 27a. In an implementation, the thickness TH3 of the inner ring 27a may be, e.g., 5 mm to 7.5 mm. In an implementation, the outer ring 27b may have a thickness TH4 (in the radial direction D2) of, e.g., 5 mm to 10 mm, and a height H (in the vertical direction D1) of, e.g., 7 mm to 20 mm. In an implementation, the upper surface of the inner edge ring 27 may have a width (in the radial direction D2) ranging from 20 mm to 30 mm. For example, a sum of a width (in the radial direction D2) of the upper surface of the inner ring 27a and the thickness TH4 (in the radial direction D2) of an upper surface of the outer ring 27b may be, e.g., 20 mm to 30 mm.

Figure 4:
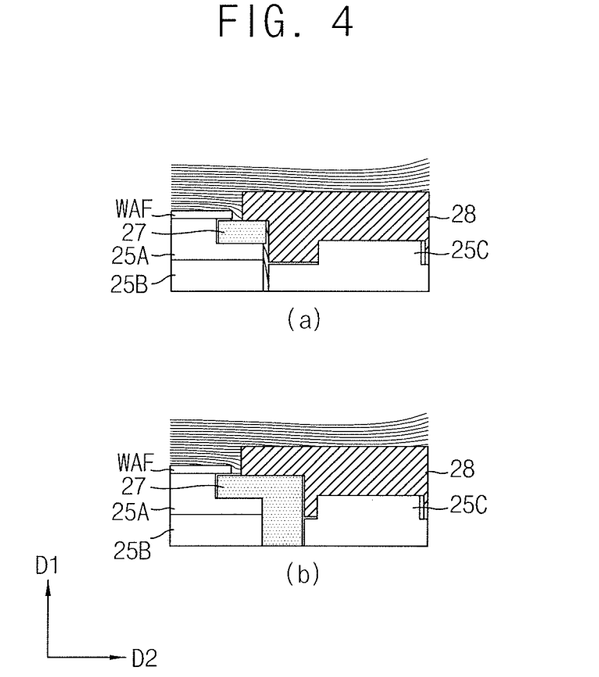
FIG. 4 illustrates cross-sectional views of a variation in electric field in a substrate processing apparatus according to an example embodiment.

FIG. 4 illustrates cross-sectional views of a variation in electric field in a substrate processing apparatus according to an example embodiment. In FIGS. 1 to 4, the same reference numerals are used to denote the same elements. Hereinafter, repeated descriptions which are substantially the same as in FIGS. 1 and 3 may be omitted for brevity.

In a substrate processing apparatus devoid of an inner edge ring, the distortion of an electric field could occur in an edge region due to discontinuity of a substrate (having a semiconductor property) and an outer edge ring (having an insulating property). For example, ion tilting could occur during an etching process. Referring to parts (a) and (b) of FIG. 4, the substrate processing apparatus according to an embodiment may help reduce the distortion of an electric field in an edge region of the substrate WAF (e.g., a wafer). For example, the electric field may planarly extend toward the outer edge ring 28 due to the inner edge ring 27 having a semiconductor property. The tilting of etching ions due to the distortion of the electric field may be prevented and/or compensated for. Accordingly, a wafer etching rate and critical-dimension (CD) uniformity of patterns may be improved. In an implementation, as shown in part (b) of FIG. 4, the inner edge ring 27 may include an outer ring 27b, an overall volume of the inner edge ring 27 may be increased, and the electric field may be further planarized and uniformized outward.

Figure 5A:
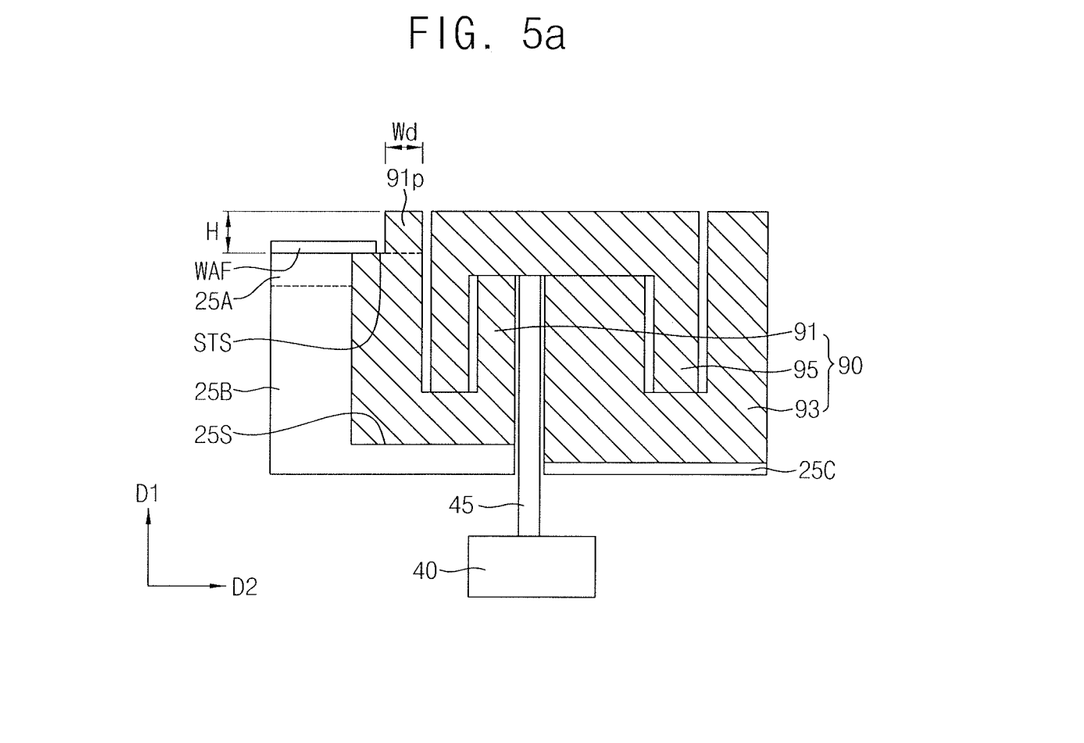
FIG. 5a illustrates an enlarged cross-sectional view of a partial region of a substrate processing apparatus according to an example embodiment.
Figure 5B:
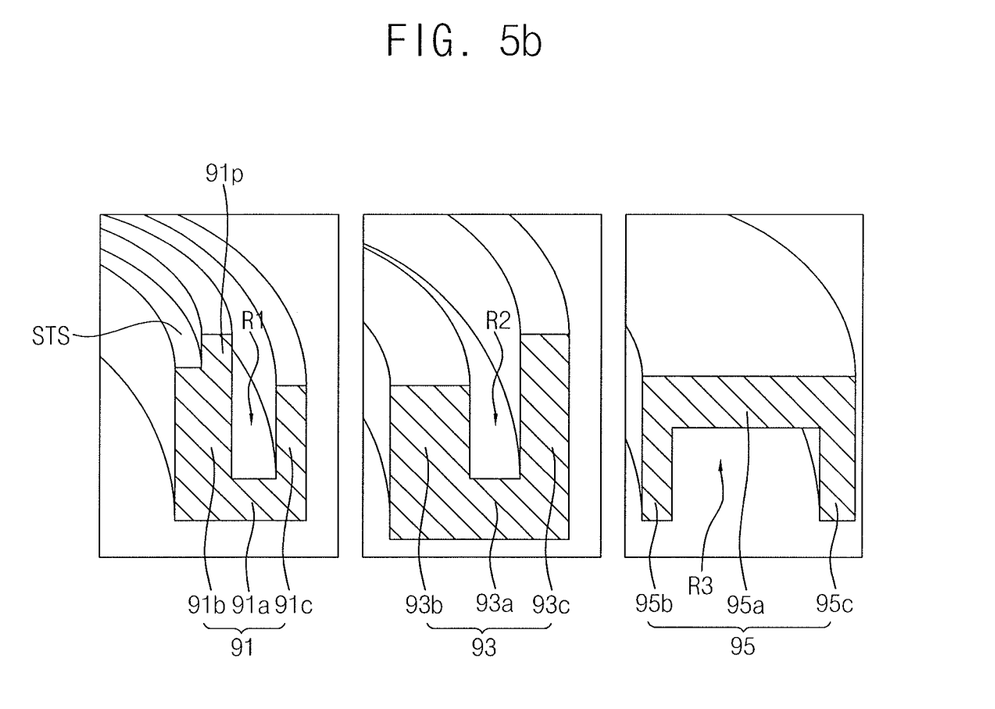
Figure 6:
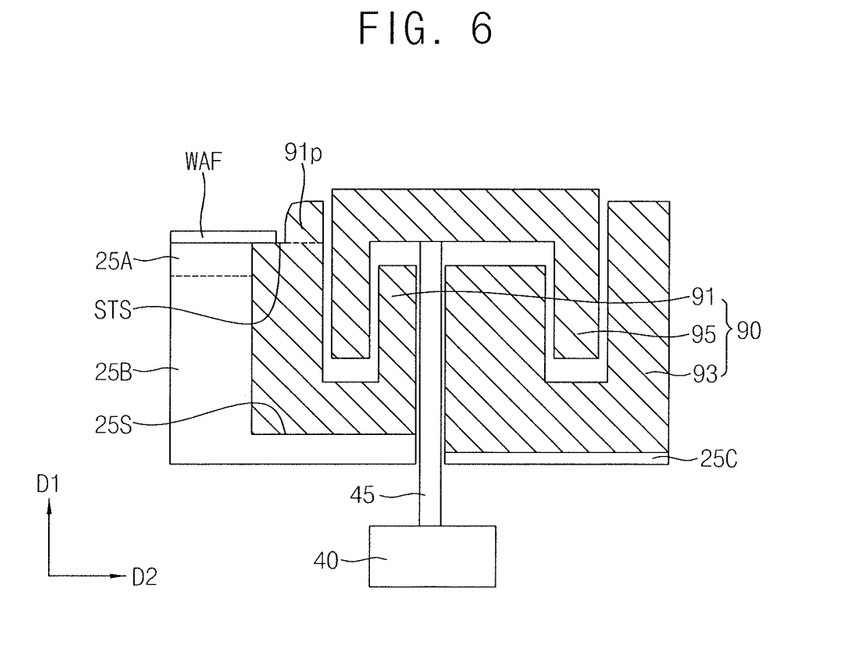
FIG. 6 illustrates an enlarged cross-sectional view of a partial region of a substrate processing apparatus according to an example embodiment.

FIG. 5a illustrates an enlarged cross-sectional view of a partial region of a substrate processing apparatus according to an example embodiment. FIG. 5b illustrates enlarged cross-sectional perspective views of a portion of an edge ring shown in FIG. 5a. FIG. 6 illustrates an enlarged cross-sectional view of a partial region of a substrate processing apparatus according to an example embodiment. The region A of the substrate processing apparatus of FIG. 1 may include the example embodiments of FIGS. 5a to 6 instead of the example embodiments shown in FIGS. 2 and 3. In FIGS. 1 to 6, the same reference numerals are used to denote the same or like elements. Hereinafter, repeated descriptions which are substantially the same as in FIGS. 1 and 4 may be omitted for brevity.

Referring to FIGS. 1, 5a, 5b, and 6, an edge ring 90 of the substrate processing apparatus may include a first edge ring 91, a second edge ring 93, and a third edge ring 95. The substrate processing apparatus may include a susceptor 26 having a shape that is different from those of FIGS. 2 and 3 and a configuration and a function that are the same as or similar to those of FIGS. 2 and 3. The susceptor 26 may include a first portion 25A (e.g., a substrate mount on which a substrate WAF is mountable), a second portion 25B under the first portion 25A and having a step surface 25S, and a third portion 25C disposed outside (e.g., surrounding) the first portion 25A and the second portion 25B. The substrate processing apparatus may include a lift pin 45 connected to the third edge ring 95 and an actuator 40 under (e.g., coupled with) the lift pin 45. The actuator 40 may move the lift pin 45 and the third edge ring 95 vertically (e.g., in the vertical direction D1). The first edge ring 91 may be adjacent to the first portion 25A and the second portion 25B of the susceptor 26. The first edge ring 91 may be on (e.g., the step surface of) the second portion 25B. The second edge ring 93 may be on the third portion 25C. The second edge ring 93 may be spaced apart from the first edge ring 91 outside the first edge ring 91 (e.g., may surround the first edge ring 91). The third edge ring 95 may be coupled with the first edge ring 91 to move vertically (e.g., in the vertical direction D1), e.g., on the second edge ring 93. The first to third edge rings 91, 93, and 95 may be combined or coupled with each other into an interdigitated structure.

The first edge ring 91 may be on the second portion 25B of the susceptor 26, and a portion of the first edge ring 91 may overlap, underlie, and/or be in contact with an edge portion of the substrate WAF. In an implementation, the first edge ring 91 may be stationary with respect to (e.g., may be fixed in position relative to) the first portion 25A and/or the second portion 25B of the susceptor 26.

The first edge ring 91 may have a roughly U-shaped cross-section. The first edge ring 91 may include a first body 91a, a first inner ring 91b, a protrusion 91p, and a first outer ring 91c. The first edge ring 91 may include a first insertion groove R1 between the first inner ring 91b and the first outer ring 91c.

The first body 91a may be on the second portion 25B of the susceptor 26. The first inner ring 91b may vertically protrude upwardly (e.g., in the vertical direction D1) from a (e.g., inward) side of the first body 91a. An upper surface of the first inner ring 91b may be substantially coplanar with an upper surface of the first portion 25A of the susceptor 26. The first inner ring 91b may overlap (e.g., underlie) a portion of the substrate WAF. For example, the first inner ring 91b may be in contact with (e.g., in direct contact with) a lower surface of the substrate WAF. In an implementation, the first inner ring 91b may include a step surface STS in contact with the lower surface of the substrate WAF, and an upper surface at a higher level than an upper surface of the substrate WAF.

In an implementation, the step surface STS of the first inner ring 91b may be spaced apart from the lower surface of the substrate WAF (e.g., in the vertical direction D1) such that the lower surface of the substrate WAF may be at a higher level than the step surface STS. In an implementation, a difference in height (in the vertical direction D1) between the step surface STS of the first inner ring 91b and the lower surface of the substrate WAF may be, e.g., about 0.15 mm. In an implementation, a difference in height (in the vertical direction D1) between the step surface STS of the first inner ring 91b and the upper surface of the first portion 25A may be, e.g., about 0.15 mm. In an implementation, the upper surface of the first portion 25A may be higher than the upper surface of the step surface STS.

The protrusion 91p may be on a portion of an upper (e.g., distal) end of the first inner ring 91b. In an implementation, the upper surface of the first inner ring 91b may be stepped due to the protrusion 91p such that an outer side (relative to the first portion 25A) of the upper surface of the first inner ring 91b may be at at a lower level than an inner side thereof. An upper surface of the protrusion 91p may be disposed at a higher level than the upper surface of the first portion 25A of the susceptor 26. The upper surface of the protrusion 91p may be at a higher level than the upper surface of the substrate WAF. The upper surface of the protrusion 91p may be substantially coplanar with an upper surface of the second edge ring 93. A lower end of the protrusion 91p may be at substantially the same level as the upper surface of the first portion 25A. The lower end of the protrusion 91p may be at substantially the same level as the upper surface of the substrate WAF.

The protrusion 91p may have a lateral thickness Wd (e.g., in the radial direction D2) of, e.g., 0.1 mm to 20 mm. The protrusion 91p may have a vertical thickness H (e.g., in the vertical direction D1) of, e.g., 0.01 mm to 10 mm. In an implementation, the vertical thickness H (e.g., in the vertical direction D1) of the protrusion 91p may be a vertical distance from a level of the step surface STS of the first inner ring 91b to a level of the upper surface of the protrusion 91p (e.g., in the vertical direction D1). In an implementation, when the step surface STS of the first inner ring 91b is in contact with the lower surface of the substrate WAF, the vertical thickness H of the protrusion 91p may be a vertical distance from a level of the upper surface of the first portion 25A to the level of the upper surface of the protrusion 91p (e.g., in the vertical direction D1). The vertical thickness H of the protrusion 91p may be a vertical distance from a level of a bottom surface of the substrate WAF to the level of the upper surface of the protrusion 91p (e.g., in the vertical direction D1).

The first outer ring 91c may vertically protrude upwardly (e.g., in the vertical direction D1) from an outward or outer side of the first body 91a. An upper surface of the first outer ring 91c may be at a lower level than the upper surface (or the step surface STS) of the first inner ring 91b (e.g., a distance from the first body 91a to the upper surface of the first outer ring 91c in the vertical direction D1 may be less than a distance from the first body 91a to the upper surface or the step surface STS of the first inner ring 91b in the vertical direction D1).

The first insertion groove R1 may be defined by the first body 91a, the first inner ring 91b, and the first outer ring 91c. The first insertion groove R1 may open upwardly (e.g., away from the first body 91a). The third edge ring 95 may be inserted into and combined or coupled with the first insertion groove R1.

The second edge ring 93 may be on the third portion 25C of the susceptor 26 outside the first edge ring 91. An upper surface of the third portion 25C may be at a lower level than the step surface 25S of the second portion 25B (on which the first edge ring 91 is mounted). A lower surface of the second edge ring 93 may be at a lower level than a lower surface of the first edge ring 91. In an implementation, the second edge ring 93 may be stationary with respect to the third portion 25C of the susceptor 26. The first edge ring 91 and the second edge ring 93 may be referred to as stationary edge rings.

The second edge ring 93 may have a roughly U-shaped cross-section. The second edge ring 93 may include a second body 93a, a second inner ring 93b, and a second outer ring 93c. The second edge ring 93 may include a second insertion groove R2. The first insertion groove R1 and the second insertion groove R2 may be referred to as stationary insertion grooves.

In an implementation, the second body 93a may be on the third portion 25C of the susceptor 26. In an implementation, a lower portion of the second body 93a may include (e.g., may be integral with) the third portion 25C of the susceptor 26.

The second inner ring 93b may protrude upwardly (e.g., in the vertical direction D1) from an upper portion of an inward or inner side of the second body 93a. In an implementation, the upper surface of the second inner ring 93b may be at substantially the same level as the first inner ring 91b of the first edge ring 91.

The second outer ring 93c may protrude upwardly (e.g., in the vertical direction D1) from an upper portion of an outward or outer side of the second body 93a. An upper surface of the second outer ring 93c may be at a higher level than the upper surface of the second inner ring 93b. The upper surface of the second outer ring 93c may be at substantially the same level as an upper end of the protrusion 91p of the first edge ring 91.

The second insertion groove R2 may be defined by the second body 93a, the second inner ring 93b, and the second outer ring 93c. The second insertion groove R2 may be formed to open upwardly (e.g., away from the second body 93a). The third edge ring 95 may be inserted into and combined or coupled with the second insertion groove R2.

The third edge ring 95 may be on the first edge ring 91 and the second edge ring 93. As shown in FIG. 6, the third edge ring 95 may be connected to the lift pin 45, which may vertically extend between the first edge ring 91 and the second edge ring 93, and move vertically (e.g., in the vertical direction D1). The third edge ring 95 may be referred to as a movable edge ring. The third edge ring 95 may overlap the first body 91a, the first outer ring 91c, the second inner ring 93b, and the second body 93a (along the vertical direction D1).

The third edge ring 95 may have an inverted roughly U-shaped cross-section. The third edge ring 95 may have a third body 95a, a third inner ring 95b, and a third outer ring 95c. The third edge ring 95 may include a third insertion groove R3. The third insertion groove R3 may be formed to open downwardly (e.g., away from the third body 95a). The third insertion groove R3 may be referred to as a movable insertion groove.

The third body 95a may overlap the first outer ring 91c of the first edge ring 91 and the second inner ring 93b of the second edge ring 93 (along the vertical direction D1). In one position, a level of an upper surface of the third body 95a may be substantially the same as the upper surface of the protrusion 91p of the first edge ring 91 and an upper surface of the third outer ring 95c of the third edge ring 95. The third inner ring 95b may be inserted into the first insertion groove R1 of the first edge ring 91. The third outer ring 95c may be inserted into the second insertion groove R2 of the second edge ring 93. When the third inner ring 95b is inserted into the first insertion groove R1 and the third outer ring 95c is inserted into the second insertion groove R2, the first outer ring 91c and the second inner ring 93b may be inserted into the third insertion groove R3. For example, the first edge ring 91, the second edge ring 93, and the third edge ring 95 may have an interdigitated combination structure (e.g., an interengaging or complementary structure).

Referring to FIG. 6, the third edge ring 95 may be moved up or down (e.g., in the vertical direction D1) by the lift pin 45. As the substrate processing apparatus is performing a plasma etching process, the substrate WAF may be etched and also, respective upper surfaces of the first edge ring 91, the second edge ring 93, and the third edge ring 95 exposed to plasma may be worn out so that heights of the first to third edge rings 91, 93, and 95 may be reduced. In an implementation, an edge of the protrusion 91p of the first edge ring 91, adjacent to the substrate WAF may be worn down. An edge of the third edge ring 95 adjacent to the substrate WAF may also be worn down. When the first to third edge rings 91, 93, and 95 are worn down, an electric field could be changed such as to reduce plasma uniformity on the substrate WAF. In an implementation, the actuator 40 may lift the third edge ring 95 (connected to the lift pin 45) so that the third edge ring 95 may be maintained at a constant or desired height. By appropriately maintaining the height of the third edge ring 95, an electric field in an edge region of the substrate WAF may be planarized and uniformized outward. In addition, the protrusion 91p of the first edge ring 91 may be exposed to plasma, and when the third edge ring 95 is moved upwardly, a region in which the electric field is planarized may be precisely adjusted.

Figure 7:
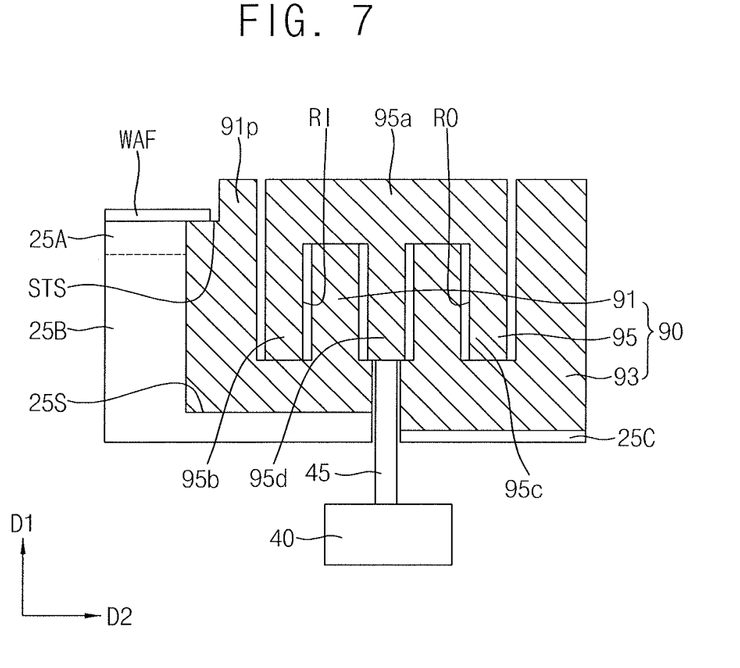
FIG. 7 illustrates an enlarged cross-sectional view of a partial region of a substrate processing apparatus according to an example embodiment.

FIG. 7 illustrates an enlarged cross-sectional view of a partial region of a substrate processing apparatus according to an example embodiment. In FIGS. 1 to 7, the same reference numerals are used to denote the same elements.

Referring to FIG. 7, a third edge ring 95 may include a third body 95a, a third inner ring 95b, a third outer ring 95c, and a third central ring 95d. The third edge ring 95 may have a roughly E-shaped cross-section. The third inner ring 95b may be inserted into an insertion groove of a first edge ring 91. The third outer ring 95c may be inserted into an insertion groove of a second edge ring 93. The third central ring 95d may be inserted into a space between the first edge ring 91 and the second edge ring 93. A lower end of the third central ring 95d may be connected to the lift pin 45.

The third edge ring 95 may include an inner insertion groove RI between the third inner ring 95b and the third central ring 95d. The third edge ring 95 may include an outer insertion groove RO between the third central ring 95d and the third outer ring 95c. The first edge ring 91 may be inserted into the inner insertion groove RI. The second edge ring 93 may be inserted into the outer insertion groove RO.

Figure 8:
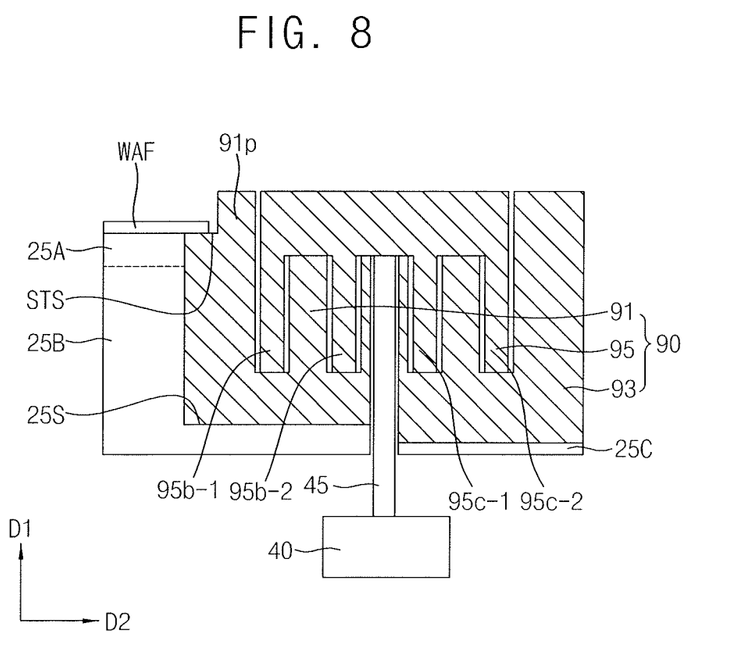
FIG. 8 illustrates an enlarged cross-sectional view of a partial region of a substrate processing apparatus according to an example embodiment.

FIG. 8 illustrates an enlarged cross-sectional view of a partial region of a substrate processing apparatus according to an example embodiment. In FIGS. 1 to 8, the same reference numerals are used to denote the same elements.

Referring to FIG. 8, the third edge ring 95 may include a plurality of third inner rings 95b-1 and 95b-2 and a plurality of third outer rings 95c-1 and 95c-1. The first edge ring 91 may have a plurality of insertion grooves. The second edge ring 93 may have a plurality of insertion grooves. The plurality of third inner rings 95b-1 and 95b-2 of the third edge ring 95 may be respectively inserted into the plurality of insertion grooves of the first edge ring 91. The plurality of third outer rings 95c-1 and 95c-2 of the third edge ring 95 may be respectively inserted into the plurality of insertion grooves of the second edge ring 93.

Figure 9:
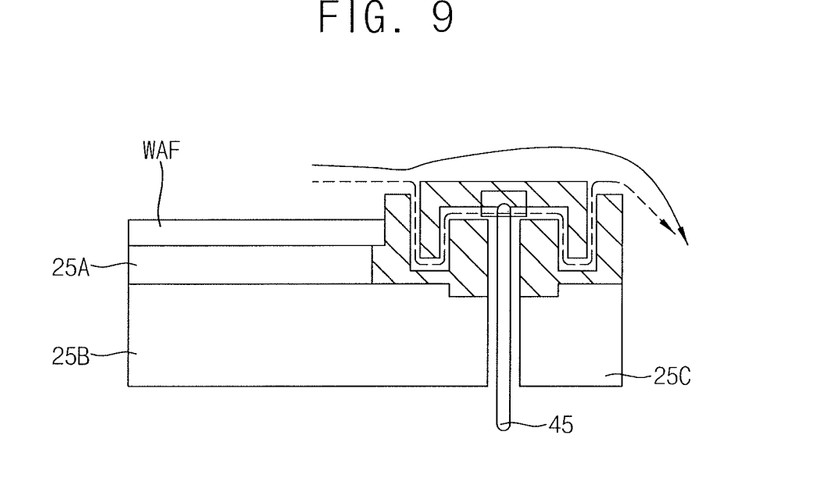
FIG. 9 illustrates an enlarged cross-sectional view of a partial region of a substrate processing apparatus according to an example embodiment.

FIG. 9 illustrates an enlarged cross-sectional view of a partial region of a substrate processing apparatus according to an example embodiment. In FIGS. 1 to 9, the same reference numerals are used to denote the same elements.

Referring to FIG. 9, gaps may be formed between first to third edge rings 91, 93, and 95 in the substrate processing apparatus. For example, air gaps may be formed between the first to third edge rings 91, 93, and 95, and a process gas may pass through the air gaps. When edge rings (e.g., the first to third edge rings 91, 93, and 95) have an interdigitated combination structure, lengths of the air gaps through which the process gas has to pass may increase, and a flow resistance may increase. Thus, the amount of the process gas that unnecessarily escapes from the air gaps in the substrate processing apparatus may be reduced so that the influence of air flow of the process gas upon an etching process may be reduced. Further, the inflow of a polymer into the air gaps may be reduced. FIG. 9 illustrates the example embodiment shown in FIGS. 5A and 5B. In an implementation, the same effects may also be obtained in the example embodiment shown in FIGS. 7 and 8 in which the first to third edge rings 91, 93, and 95 have the interdigitated combination structure.

Figure 10:
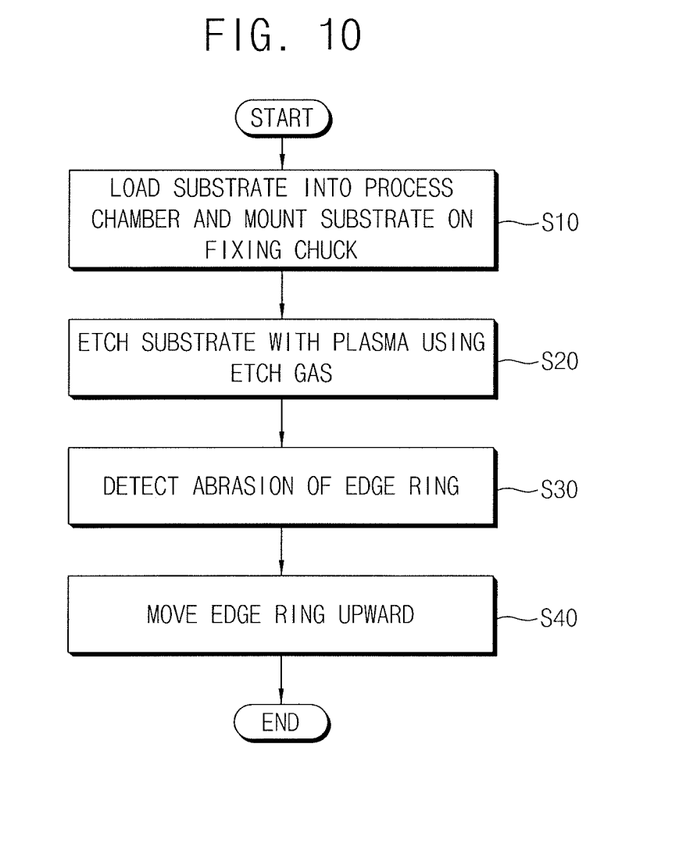
FIG. 10 illustrates a flowchart of an operation of a substrate processing apparatus according to an example embodiment.

FIG. 10 illustrates a flowchart of an operation of a substrate processing apparatus according to an example embodiment. In FIGS. 1 to 10, the same reference numerals are used to denote the same elements. In FIG. 10, it is assumed that the substrate processing apparatus of FIG. 1 includes the example embodiments shown in FIGS. 5A and 6.

Referring to FIGS. 1 and 10, a substrate WAF may pass through a gate 14 and be loaded into a process chamber 100. The substrate WAF may be mounted on a fixing chuck 25 included in a substrate stage 20 and adsorbed on the fixing chuck 25 due to an ESC (S10).

The substrate processing apparatus may selectively etch the substrate WAF with plasma using an etch gas supplied from a gas supply unit 60 (S20). When the process of etching the substrate WAF is completed, the substrate WAF may be separated from the fixing chuck 25, and the substrate WAF may be withdrawn from the process chamber 100.

As an etching process and/or a cleaning process are performed repeatedly and consecutively, the edge ring 90 may be corroded or abraded simultaneously. When the edge ring 90 corrodes, a relative height of the edge ring 90 relative to the substrate WAF could be reduced, possibly resulting in the distortion of plasma in an edge region of the substrate WAF and an etching failure in the edge region of the substrate WAF. The abrasion of the edge ring 90 may be observed using various methods of detecting the abrasion of the edge ring 90 (S30). For example, the corrosion or abrasion of the edge ring 90 may be observed by detecting the etching failure in the edge region of the substrate WAF. The corrosion or abrasion of the edge ring 90 may be visually observed. In an implementation, the edge ring 90 may be set or assumed to have been corroded after the etching process is repeated a predetermined number of times.

If the corrosion and abrasion of the edge ring 90 is observed, a controller 300 may drive an actuator 40 to move the lift pin 45 upwardly so that the third edge ring 95 of the edge ring 90 connected to the lift pin 45 may be moved upwardly (S40). For example, even if an upper surface of the edge ring 90 corrodes, the upper surface of the third edge ring 95 may be maintained at a constant height from or relative to the substrate WAF.

The edge ring 90 may be moved upwardly, and the substrate WAF may be loaded again into the process chamber 100 and selectively etched. In an implementation, the substrate WAF may be replaced before and after the edge ring 90 is moved upwardly. The process of etching the substrate WAF, the operation of replacing the substrate WAF, and the operation of moving the edge ring 90 upwardly may be repeatedly performed. Therefore, a use period of the edge ring 90 may be extended without replacing the edge ring 90, and plasma may be uniformly distributed on the substrate WAF so as to uniformly etch the substrate WAF.

Figure 11:
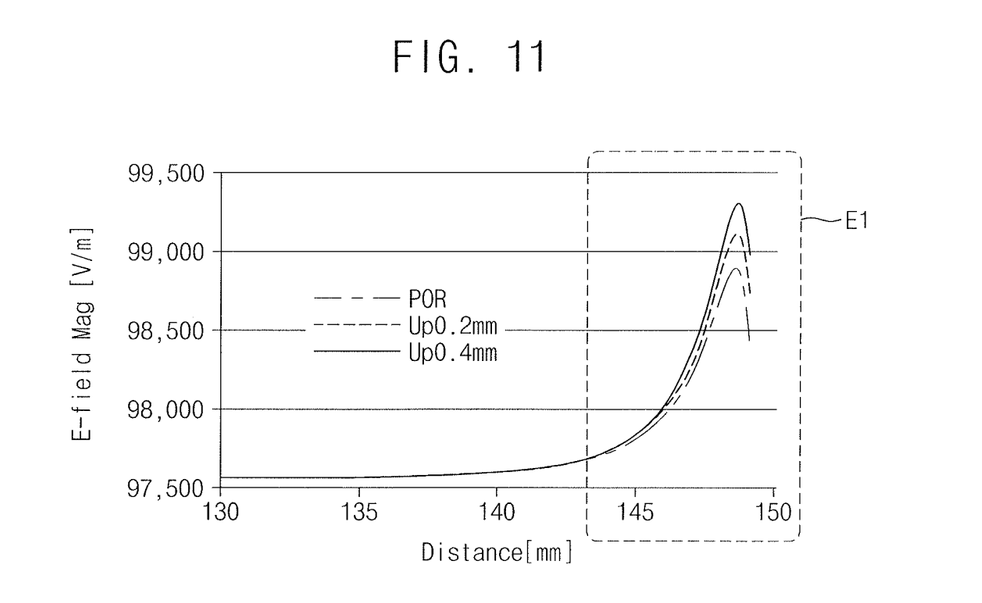
FIG. 11 illustrates a graph of the intensity of an electric field relative to a region of a substrate in a substrate processing apparatus according to an example embodiment.
Figure 12:
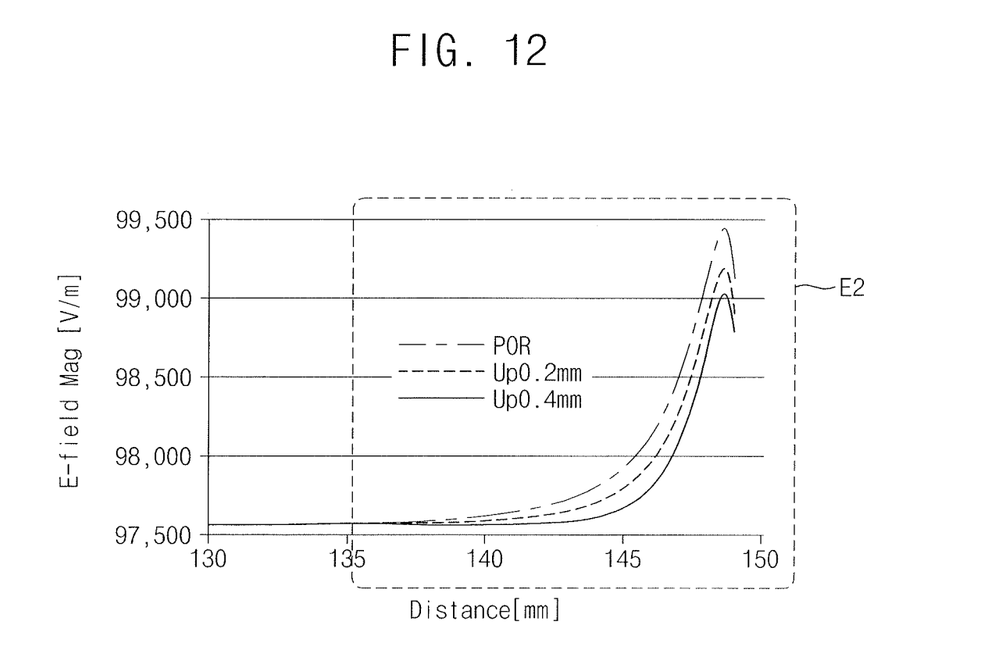
FIG. 12 illustrates a graph of the intensity of an electric field relative to a region of a substrate in a comparative substrate processing apparatus.

FIG. 11 illustrates a graph of the intensity of an electric field relative to a region of a substrate in a substrate processing apparatus according to an example embodiment. FIG. 12 illustrates a graph of the intensity of an electric field relative to a region of a substrate in a comparative substrate processing apparatus.

FIG. 11 illustrates experimental results obtained using a substrate processing apparatus including the configuration of FIG. 5A. Referring to FIGS. 5A and 11, the substrate processing apparatus used to obtain the experimental results of FIG. 11 may include a protrusion 91p having a lateral thickness Wd (in the radial direction D2) of 2 mm and a vertical thickness H (in the vertical direction D1) of 4.865 mm. A lower surface of a substrate WAF or an upper surface of a first portion 25A may be at a level that is 0.15 mm higher than a step surface STS of a first inner ring 91b. As described with reference to FIGS. 5A, 5B, 6, and 10, upper portions of the first edge ring 91, the second edge ring 93, and/or the third edge ring 95 exposed to plasma may be worn down and an electric field may be changed and plasma uniformity on the substrate WAF could be damaged. In this case, the third edge ring 95 may be moved upwardly to compensate therefor, e.g., to help maintain plasma uniformity.

FIG. 11 illustrates the intensity of an electric field relative to a variation in height of the third edge ring 95 and a region in which the intensity of the electric field is changed. For example, FIG. 11 illustrates a comparison of a variation in the intensity of the electric field among a case in which the third edge ring 95 is not lifted (POR), a case in which the third edge ring 95 is lifted by 0.2 mm (up 0.2 mm), and a case in which the third edge ring 95 is lifted by 0.4 mm (up 0.4 mm).

Referring to FIG. 11, it may be seen that when the third edge ring 95 was lifted by 0.2 mm, the intensity of the electric field became higher than when the third edge ring 95 was not lifted, and when the third edge ring 95 was lifted by 0.4 mm, the intensity of the electric field became higher than when the third edge ring 95 was lifted by 0.2 mm. Further, it may be seen that, in both cases in which the third edge ring 95 was lifted by 0.2 mm and 0.4 mm, the intensity of the electric field was changed only in a region E1 having a radius of more than 140 mm in the substrate WAF. For example, from the graph of FIG. 11, it may be seen that, when the first edge ring 91 includes the protrusion 91p, even if the third edge ring 95 is lifted, the intensity of the electric field and plasma uniformity may be adjusted only in a required region (i.e., the region E1 having the radius of more than 140 mm in the substrate WAF).

In the substrate processing apparatus used to obtain results of FIG. 12, a first edge ring 91 was devoid of a protrusion 91p, and an upper end of the first edge ring 91 was under a substrate WAF. Also, a third edge ring 93 was adjacent to a side surface of the substrate WAF.

Referring to FIG. 12, when the first edge ring 91 is devoid of the protrusion 91p, a region in which the intensity of an electric field was changed according to a variation in height of a third edge ring 95 is a region E2 having a radius of 135 mm or more in the substrate WAF, and the intensity of the electric field was adjusted even in a region having a radius ranging from 135 mm to 140 mm, in which it is unnecessary to adjust the intensity of the electric field. Furthermore, it may be seen that, as the height of the third edge ring 95 increases, the intensity of an electric field applied to an edge region of the substrate WAF is reduced. When the results of FIG. 11 are compared with the results of FIG. 12, when the protrusion 91p is formed in the first edge ring 91, the region in which the intensity of the electric field is changed may be adjusted only in the region E1. For example, it may be seen that the intensity of the electric field may be efficiently adjusted according to a region of the substrate WAF, and a difference in etch rate relative to a position on the substrate WAF may be improved.

According to the example embodiments, a substrate processing apparatus may help improve an etch rate and critical-dimension (CD) uniformity of patterns in an edge region of a substrate. The substrate processing apparatus may precisely control a region in which an electric field is changed according to a variation in height of an edge ring.

One or more embodiments may provide a substrate processing apparatus that may help increase the processing efficiency of a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising: a process chamber; a susceptor in the process chamber, the susceptor has an upper surface on which a substrate is mountable and a step surface located at a level lower than the upper surface; a first edge ring on the step surface; a second edge ring outside the first edge ring; a third edge ring on the first edge ring and the second edge ring; and an actuator and a lift pin to vertically move the third edge ring, wherein: the first edge ring and the second edge ring are stationary relative to the susceptor, the third edge ring is coupled with the first edge ring and the second edge ring such that the third edge ring is vertically movable relative to the first edge ring and the second edge ring, the first edge ring has a U-shaped cross-section that includes a first inner ring and a first outer ring, which protrude upwardly, and a first insertion groove between the first inner ring and the first outer ring, the second edge ring has a U-shaped cross-section that includes a second inner ring and a second outer ring, which protrude upwardly, and a second insertion groove between the second inner ring and the second outer ring, the third edge ring has a third inner ring inserted into the first insertion groove, a third outer ring inserted into the second insertion groove, and a third insertion groove into which the first outer ring and the second inner ring are inserted, and the lift pin vertically extends between the first edge ring and the second edge ring and is connected to the third edge ring.

2. The substrate processing apparatus as claimed in claim 1, wherein the first edge ring has:
a step surface vertically overlapping the substrate, and
an upper surface at a higher level than an upper surface of the substrate.

3. The substrate processing apparatus as claimed in claim 2, wherein an upper surface of the third edge ring is at the same level as or a higher level than the upper surface of the first edge ring.

4. The substrate processing apparatus as claimed in claim 1,
wherein the lift pin is connected to the third edge ring at the third insertion groove thereof.

5. A substrate processing apparatus, comprising:
a process chamber;
a susceptor inside the process chamber and having an upper surface on which a substrate is mountable and a step surface at a level lower than the upper surface;
a first stationary edge ring on the step surface of the susceptor;
a second stationary edge ring outside the first stationary edge ring;
a movable edge ring on the first stationary edge ring; and
an actuator and a lift pin to vertically move the movable edge ring,
wherein:
the first stationary edge ring has:
a step surface vertically overlapping the substrate when mounted on the susceptor, and
an upper surface at a higher level than an upper surface of the substrate,
the movable edge ring is vertically movable to have an upper surface at the same level as or a higher level than the upper surface of the first stationary edge ring,
the first stationary edge ring has a U-shaped cross-section that includes a first stationary insertion groove between a first stationary protrusion and a second stationary protrusion,
the second stationary edge ring has a U-shaped cross-section that includes a third stationary protrusion and a fourth stationary protrusion, which protrude upwardly, and a second stationary insertion groove between the third stationary protrusion and the fourth stationary protrusion,
the movable edge ring has a first movable protrusion inserted into the first stationary insertion groove, a second movable protrusion inserted into the second stationary insertion groove, and a movable insertion groove into which the first stationary protrusion and the third stationary protrusion are inserted, and
the lift pin vertically extends between the first stationary edge ring and the second stationary edge ring and is connected to the movable edge ring.

\* \* \* \* \*